United States Patent [19]
Sugibayashi

[11] Patent Number: 5,375,096
[45] Date of Patent: Dec. 20, 1994

[54] DATA BUS SELECTOR/CONTROL CIRCUIT FOR DYNAMIC RAM

[75] Inventor: Tadahiko Sugibayashi, Tokyo, Japan
[73] Assignee: NEC Corporation, Japan
[21] Appl. No.: 932,345
[22] Filed: Aug. 19, 1992
[30] Foreign Application Priority Data
  Aug. 27, 1991 [JP] Japan .................. 3-214943
[51] Int. Cl.[5] .................. G11C 8/00; G11C 7/00
[52] U.S. Cl. .................. 365/230.06; 365/201; 365/203
[58] Field of Search .............. 365/201, 189.05, 230.06, 365/203, 194

[56] References Cited

U.S. PATENT DOCUMENTS

| | | | |
|---|---|---|---|
| 4,926,387 | 5/1990 | Madland | 365/233 |
| 4,931,995 | 6/1990 | Okasawa et al. | 365/189.05 |
| 4,991,139 | 2/1991 | Takahashi et al. | 365/201 |
| 5,088,063 | 2/1992 | Matsuda et al. | 365/201 |
| 5,191,555 | 3/1993 | Tabacco et al. | 365/230.08 |
| 5,208,778 | 5/1993 | Kumanoya et al. | 365/201 |

*Primary Examiner*—Eugene R. LaRoche
*Assistant Examiner*—Son Dinh
*Attorney, Agent, or Firm*—Laff, Whitesel, Conte & Saret, Ltd.

[57] ABSTRACT

A data bus selector/control amplifier comprises a plurality of basic circuit blocks for controlling the connection of the bus lines of a first data bus comprising a plurality of bus lines and a second data bus comprising a plurality of bus lines. The basic circuit blocks provided correspond to each of the bus lines of the second data bus. Each of the basic circuit blocks sends written data or precharging current to the second data bus via its own data amplifier. Second and third transfer gates retain the data to be written into and data to be read out from the data amplifier.

2 Claims, 7 Drawing Sheets

DATA BUS SELECTOR/CONTROL CIRCUIT FOR DYNAMIC RAM

BACKGROUND OF THE INVENTION

1. Field of the Invention

The present invention relates to dynamic RAM (random access memory) and, in particular, to dynamic RAM for reading data out after data buses having a plurality of bus lines are precharged.

2. Description of the Related Art

Conventionally, as dynamic RAM becomes large in capacity, the time required for carrying out a performance test of the RAM has increased significantly, resulting in increased cost. One measure taken against this problem is the parallel test mode. FIG. 1 is a block diagram illustrating a conventional example of dynamic RAM in which performance can be tested by means of a parallel test mode. FIG. 2 is a block diagram illustrating the data bus selector of FIG. 1, and FIG. 3 is a circuit diagram illustrating a basic circuit block of FIG. 2.

The dynamic RAM shown in FIGS. 1 through 3 has four I/O (input/output) terminals for entering the data to be written into memory cell array 6 and sending data therefrom so that four bits may be entered and sent in parallel. Further, the dynamic RAM, in order to transfer data to be written and data to be read out, comprises first data bus 11 (comprising four bus lines DBa1 through DBa4) on the I/O terminals side and second data bus 12 (comprising sixteen bus lines DBb1 through DBb16) on the memory cell array side.

Data input buffer 1 takes in the four-bit data supplied to I/O terminals IO1 through IO4, and transfers it to the corresponding bus lines DBa1 through DBa4 of first data bus 11.

During normal operation (non-test mode), data output buffer 2 transfers the read-out data transferred to the data lines DBa1 through DBa4 of first data bus 11 to corresponding I/O terminals IO1 through IO4. During test mode, four-bit test result signals TF1 through TF4 are emitted from test mode comparator 8 to I/O terminals IO1 through IO4.

During normal operation, data bus select decoder 3 activates each bus selector signal BS1 through BS16 for each bus line DBa1 through DBa4 (for example, referring to FIG. 2, it activates selector signals BS1, BS5, BS9 and BS13 at a time). During the test mode, it activates all selector signals BS1 through BS16 at a time.

Data bus selector 9 controls the connection of bus lines DBa1 through DBa4 of the first data bus 11 and bus lines DBb1 through DBb16 of the second data bus 12 according to bus selector signals BS1 through BS16. A block diagram of data bus selector 9 is illustrated in FIG. 2, and an internal basic circuit block CBxj (j=1 through 16) in FIG. 2 is illustrated in FIG. 3.

Precharger 10 precharges bus lines DBa1 through DBa4 and bus lines DBb1 through DBb16 connected via data bus selector 9 to the level of power supply potential Vcc according to precharge control signal PCx.

Write data buffer 5 supplies the data to be written from bus lines DBb1 through DBb16 of the second data bus 12 to memory cell array 6.

Memory cell array 6 stores the supplied data in memory cells located at an address specified by address signal (X1, ..., Y1, ...), or emits the stored data.

Read-out data buffer 7 transferes the data read from memory cell array 6 to bus lines DBb1 through DBb16 of second bus 12.

Test mode comparator 8 determines whether the four bits in each four-bit unit of the sixteen-bit read-out data are consistent (if they are, the memory cell array is judged as normal, and if not, it is judged as abnormal) and sends this result to test data bus 13 as test result signals TF1 through TF4.

The operation of this dynamic RAM will next be described. The sixteen bus lines DBb1 through DBb16 of second data bus 12 are arranged in four separate groups DBb1–DBb4, DBb5–DBb8, DBb9–DBb12, and DBb13–DBd16. During normal operation, each bus line DBa1 through DBa4 of first data bus 11 is connected to one of the four bus lines within a group of bus lines DBb1 through DBb16 of second data bus 12 by data bus selector 9, and the data supplied from I/O terminals IO1 through IO4 is written into memory cell array 6 four bits by four bits, while the read-out data from the memory cell array 6 is sent from I/O terminals IO1 through IO4 four bits by four bits.

During test mode operation, select signals BS1 through BS16 are all activated, and bus lines DBa1 through DBa4 of first data bus 11 are each connected to all four bus lines in each respective group of bus lines DB1 through DB16 of second data bus 12 so that four sets of the same data are written into and read out from memory cell array 6 by four-bit units (four bits by four bits) entered into test mode comparator 8. Test mode comparator 8 determines whether the data is the same for each four-bit unit or not. If not, the corresponding I/O terminals IO1 through IO4 are switched to the low level via data output buffer 2 in accordance with the corresponding test result signals TF1 through TF4. If the data is the same, the corresponding I/O terminal is switched to the high level.

This test method is called a sixteen-bit parallel test mode because sixteen-bit data is written into and read out from memory cell array 6 in parallel.

During the above-described normal operation and test mode, before data is read out from memory cell array 6, data bus lines DBa1 through DBa4 of first bus 11 and data bus lines DBb1 through DBb16 of second bus 12 are all precharged to the level of the power supply potential Vcc.

During normal operation, the above-described conventional dynamic RAM connects one of data bus lines DBa1 through DBa4 of first data bus 11 with one of data bus lines DBa1 through DBb16 of second data bus 12, and during test mode, it connects one data bus line DBa1 through DBa4 to four data bus lines DBb1 through DBb16 of second data bus 12 to write data into memory cell array 6 and to read data from it after precharging. In other words, the load to data input buffer 1 and precharger 10 is greater during test mode than during normal operation. Therefore, the operating margin during test mode decreases, and the test mode operation is less effective or less reliable.

SUMMARY OF THE INVENTION

Accordingly, an object of the present invention is to provide a novel dynamic RAM which eliminates the above-described drawback, that is, to provide a dynamic RAM which may provide the same high level of operation effectiveness and reliability during test mode as during normal operation.

In order to achieve this end, the dynamic RAM according to the present invention comprises I/O (input/output) terminals for entering data to be written into a memory cell array and emitting the same therefrom in bits in parallel, a first data bus comprising bus lines which correspond to the I/O terminals and a second data bus comprising bus lines provided corresponding to each bus line of the first data bus. Further the dynamic RAM comprises a data bus selector for selecting one bus line of the second data bus for each bus line of the first data bus during normal operation and selecting data bus lines of the second data bus for each bus line of the first data bus during test mode, and a data bus control amplifier comprising basic circuit blocks each comprising a data amplifier corresponding to each bus line of the second data bus for precharging the first and second data buses to a predetermined level according to a precharge control signal and a data holding means driving the data amplifiers for holding the data of the corresponding first and second data buses.

Further, preferably, the data bus selector and the data bus control amplifier may be integrated into a data bus selector/control amplifier, or a data bus separating means may be provided so that, during the writing operation, the intermediate portion between the first and second data buses is made non-conductive at a predetermined time.

In addition, the dynamic RAM according to the present invention comprises I/O terminals for entering data into a memory cell array and sending the data from the memory cell array in plural bits in parallel, a first data bus comprising bus lines corresponding to the I/O terminals for transferring the data, a second data bus comprising bus lines corresponding to each bus line of the first data bus, a data bus selecting decoder for giving instructions to connect one bus line of the second data bus with each bus line of the first data bus during the normal operation and connect plural bus lines of the second data bus with each bus line of the first data bus during test mode, one basic circuit block provided in correspondence to each of the bus lines of the second data bus to connect bus lines of the first and second data buses according to the instructions of the data selecting decoder, a test mode comparator to judge if the memory cell array is normal by checking data read-out on the second bus from the memory cell, whereby each said basic circuit block comprises a first transfer gate with one end connected to a data line of the first data bus, a data amplifier with one end connected to the other end of the first transfer gate, a second transfer gate with one end connected to the other end of the data amplifier which is in turn connected to a data line of the second data bus, a third transfer gate with one end connected to the other end of the first transfer gate which is in turn connected to the other end of the second transfer gate, and a gate control circuit for turning the first, second, and third transfer gates on or off.

Upon receiving the instructions to connect, the foregoing gate control circuit turns the first and second transfer gates on, and turns the third transfer gate off for writing a data in the memory cell array. After sending the data to be written to the second data bus via the data amplifier, it turns the third transfer gate on to make it hold the data for writing. In order to read out the data, the gate control circuit turns the first, second, and third transfer gates on to drive the data amplifier circuit to precharge the first and second data buses and then turns off the second transfer gate.

The above and other objects, features and advantages of the present invention will become apparent from the following description and appended claims when taken in conjunction with the accompanying drawings.

DETAILED DESCRIPTION OF THE PREFERRED EMBODIMENTS

A specific embodiment of the present invention is hereinafter described in detail with reference to the accompanying drawings.

Figure 1:
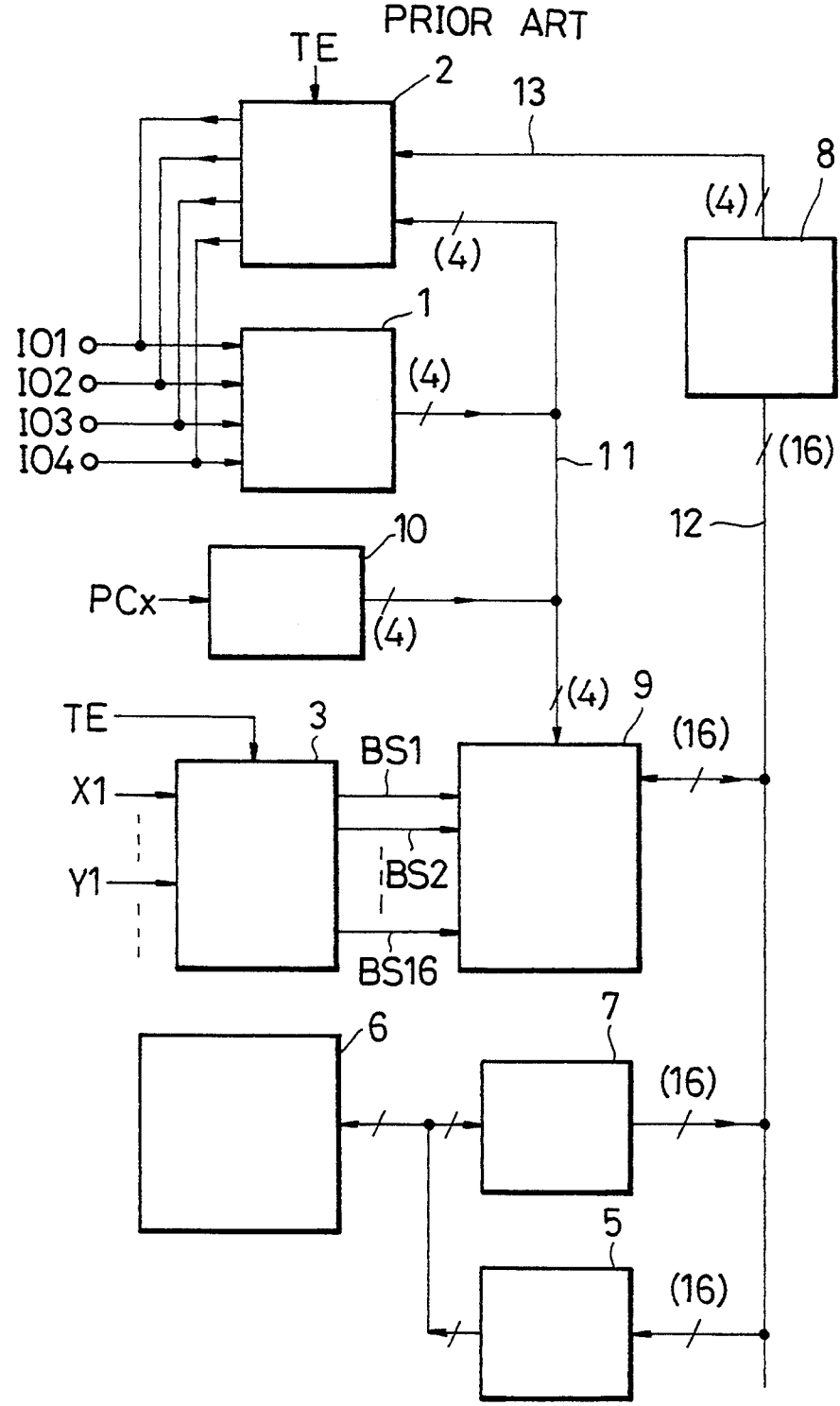
FIG. 1 is a block diagram illustrating of conventional dynamic RAM.
Figure 2:
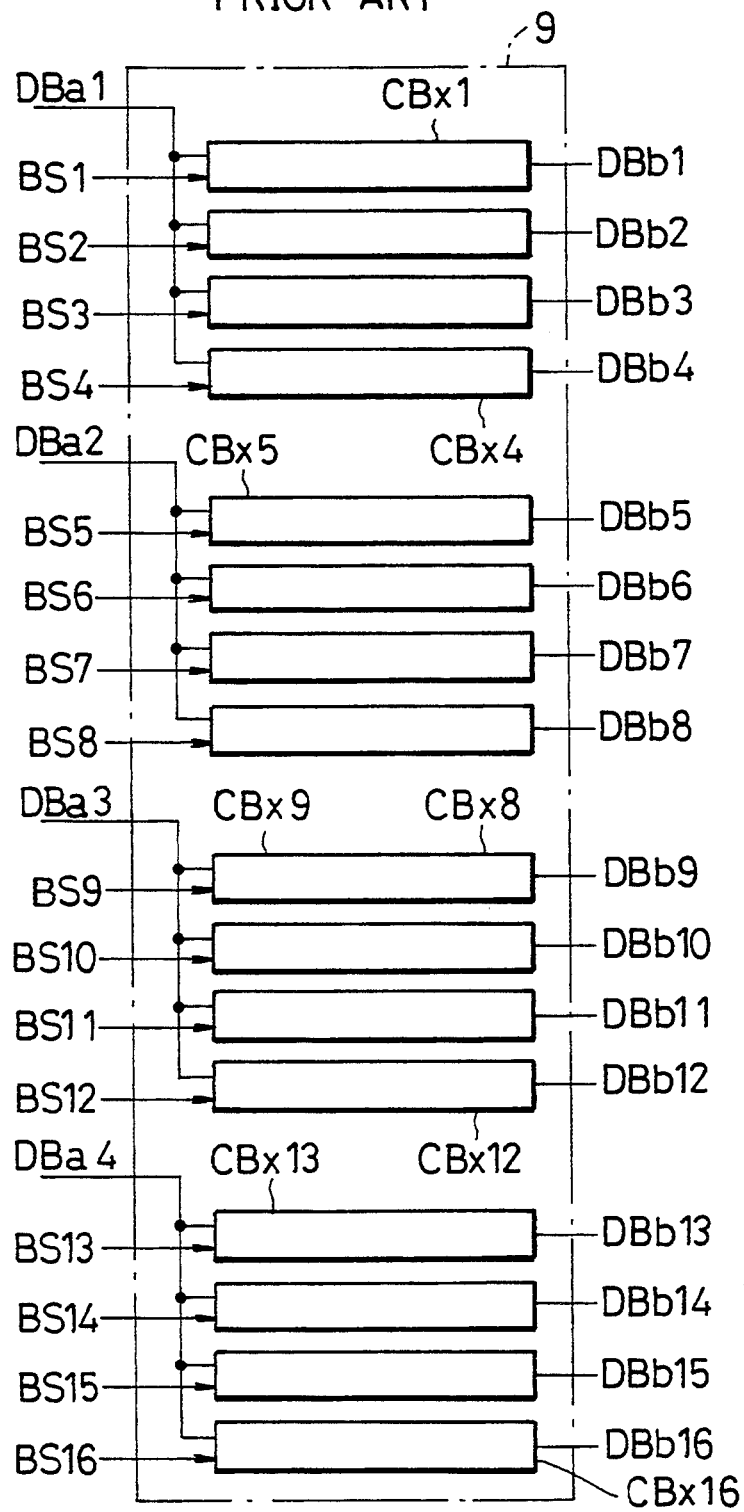
FIG. 2 is a block diagram of a data bus selector of the dynamic RAM shown in FIG. 1.
Figure 3:
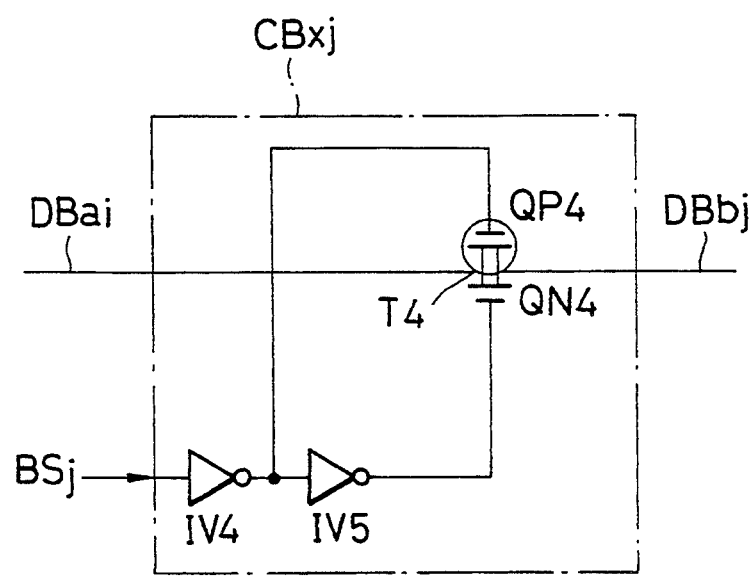
FIG. 3 is a circuit diagram of a basic circuit block of the data bus selector shown in FIG. 2.
Figure 4:
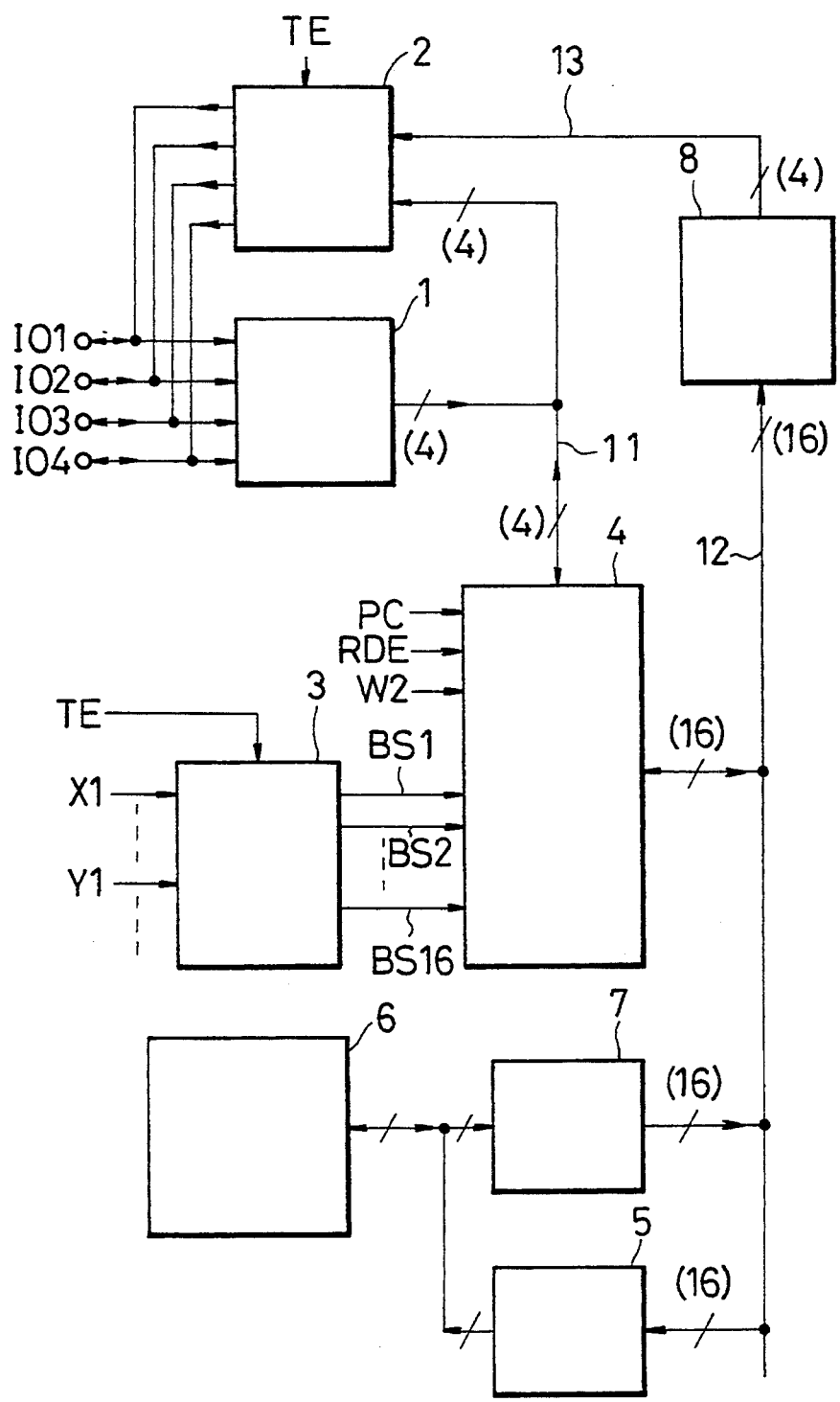
FIG. 4 is a block diagram illustrating a preferable embodiment of the present invention.
Figure 5:
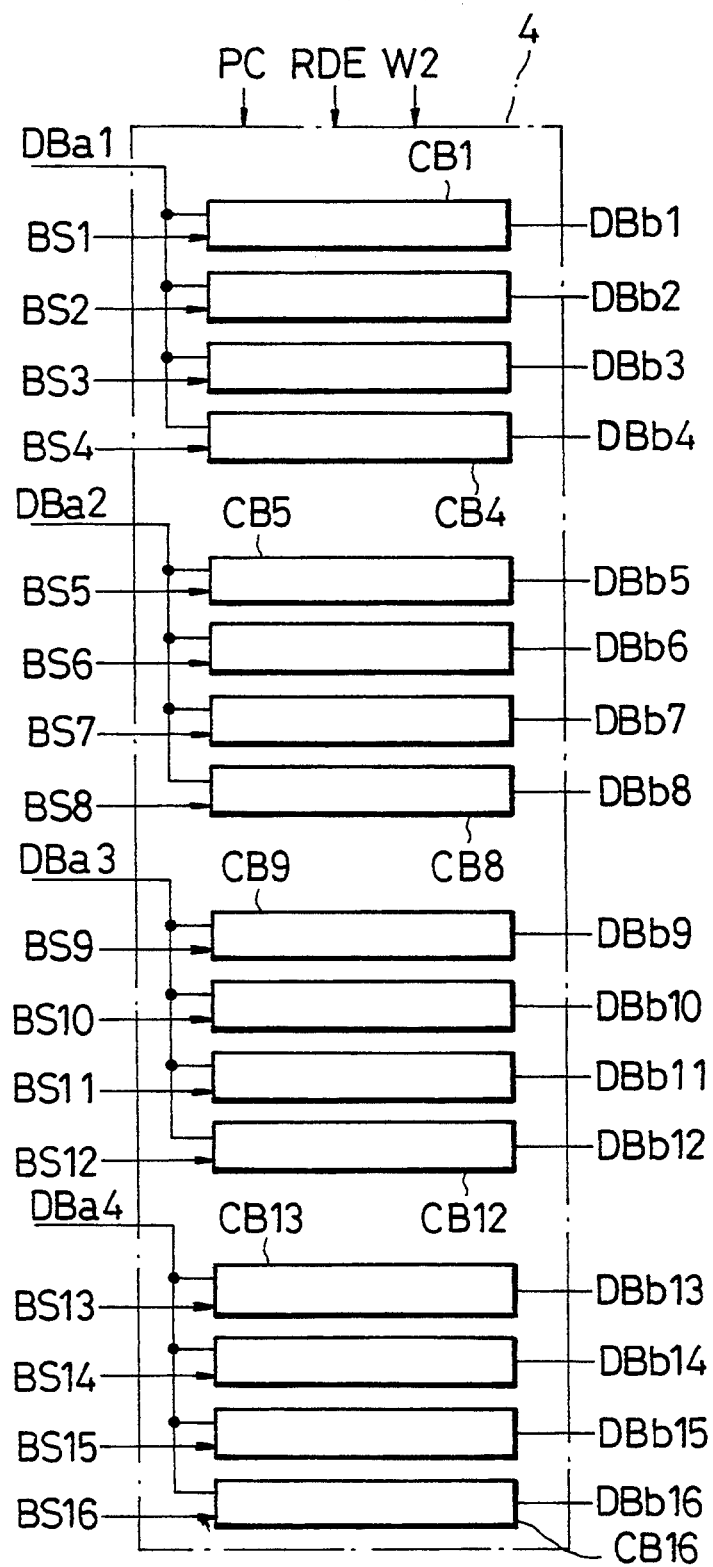
FIG. 5 is a block diagram of a data bus selector/control amplifier for the embodiment of FIG. 4.
Figure 6:
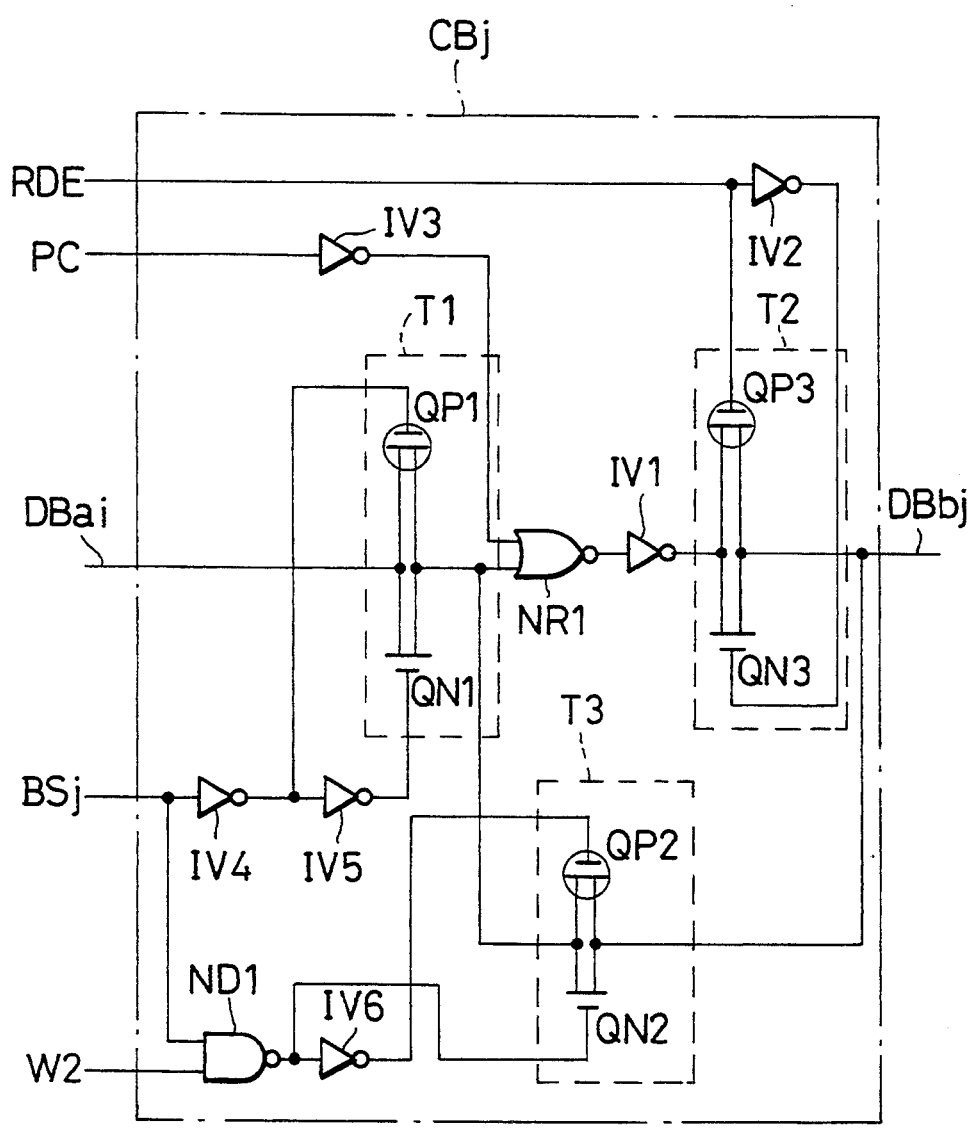
FIG. 6 is a circuit diagram of the basic circuit block within the data bus selector/control amplifier shown in FIG. 5.

The embodiment of FIGS. 4 through 6 differs from the conventional dynamic RAMs shown in FIGS. 1 through 3 in that, in place of a precharger 10 and a data bus selector 9, a data bus selector/control amplifier 4 is provided which, in addition to the functions peculiar to the conventional data bus selector 9, is further provided with a plurality of data amplifiers corresponding to each of bus lines DBb1 through DBb16 of second data bus 12 for precharging data bus lines DBa1 through DBa4 of first data bus 11 and data bus lines DBb1 through DBb16 of second data bus 12 according to a precharge signal PC, a data holding means including this data amplifier for holding data of the corresponding data bus lines DBa1 through DBa4 and DBa1 through DBb16 according to signals RDE, W2, BSj and a data separating means for turning off the intermediate portion between first and second data buses 11, 12 at a predetermined timing when data is read out or written in.

Referring to FIG. 4, data input buffer 1, data output buffer 2, data bus select decoder 3, write data buffer 5, memory cell array 6, read-out data buffer 7, test mode comparator 8, first and second data buses 11, 12, and test data bus 13 are the same as their counterparts in the conventional dynamic RAM of FIG. 1, and further detailed description is therefore omitted.

As shown in FIGS. 5 and 6, data bus selector/control amplifier 4 comprises sixteen basic circuit blocks CB1 through CB16 (hereinafter denoted by CBj, j: 1 through 16) that each correspond to data bus lines DBb1 through DBb16 (hereinafter denoted by DBbj, j: 1 through 16) of second data bus 12. Each of basic circuit blocks CBj is provided with a data bus selector portion comprising inverters IV4 through IV6, NAND gate ND1, and transfer gates T1 through T3; a data precharger portion comprising inverters IV1 as the data amplifier, NOR gate NR1, inverters IV2, IV3 and transfer gate T2; a data holder portion comprising NOR gate NR1, inverters IV1 and IV2, and transfer gates T2 and T3; and a data bus separating means comprising NAND gate ND1, inverter IV6, and transfer gate T3.

In the data bus selector portion, when data is read out, writing control signal W2 is always on the low level, and transfer gate T3 is turned on. In order to write the data, the data to be written is transferred from data bus lines DBa1 through DBa4 (hereinafter denoted by DBai, i: 1 through 4) of first data bus 11 to data bus line DBbj of second bus 12, writing control signal W2 is switched to a high level to turn transfer gate T3 off, and control signal W2 is switched to a low level to turn transfer gate T3 on to retain the data to be written.

For the precharger portion, when precharge control signal PC is switched to a low level during a predetermined period of time prior to reading of the data, the output of inverter IV1, which works as the data amplifier and the precharge signal amplifier, is correspondingly switched to a high level equal to the power supply potential Vcc, so that the low-level control signal RDE causes transfer gate T2 to be turned on and thereby precharge data bus DBbj to the power supply potential Vcc level. At this time, if the bus select signal BS1 through BS16 (hereinafter denoted by Bsj, j: 1–16) is on the selected level (high level), since transfer gates T1 and T3 are turned on, data bus DBai will also be precharged to the power supply potential Vcc level. This potential Vcc level is retained by a closed loop of the data holder portion.

When the data read from memory cell array 6 is transferred to data bus DBbj, control signal RDE is switched to a high level to turn transfer gate T2 off and cut off data bus DBbj from inverter IV1.

When the read-out data is transferred to data bus DBbj, control signal RDE is returned to the low level to form a closed loop of the data holding portion to retain the transferred read-out data. This read-out data is sent to I/O terminals IO1 through IO4 via data bus DBai and data output buffer 2.

During precharging, since the loads, which inverter IV1 of each basic circuit block CBj drives, are one bus line DBbj of second data bus 12 and one bus line DBai of first data bus 11 during both normal operation and test mode operation, there is virtually no fluctuation of the loads to the inverter IV1, with the result that the precharge potential (power supply potential Vcc) can be stably supplied to bus lines DBbj and DBai.

In addition, when the data to be written is transferred from data bus line DBai of first data bus 11 to data bus line DBbj of second data bus 12, transfer gate T3 is turned off and bus line DBai is not connected directly to bus line DBbj. During test mode, four NOR gates are connected to a single bus line DBai. However, since the capacity of the bus line amounts to several pFs while the input capacity of the NOR gate NR1 is below 1 pF, during normal operation and test mode, fluctuation in the load of data input buffer 1 is extremely small, and the load value per se is greatly reduced as compared with conventional examples in which the first and second data buses are connected one to four.

Therefore, during normal operation and test mode, differences in the operating margins relative to the data are almost eliminated and the effectiveness or reliability of the test mode operation is improved.

A specific example of the operation of dynamic RAMs shown in FIGS. 4 and 5 will now be described with reference to FIGS. 7(A) and (B), beginning with a description of the manner in which data is written and read out during normal operation.

Figure 7A:
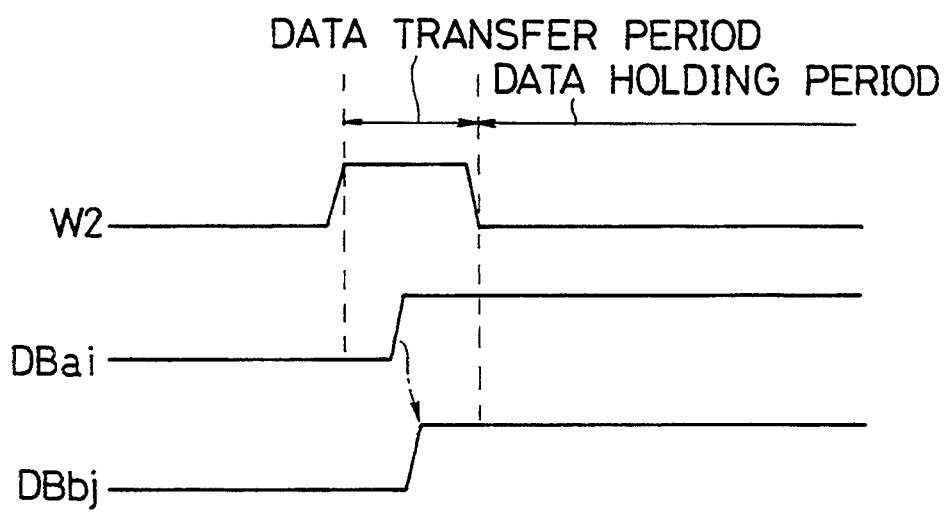
FIGS. 7A and 7B are timing charts of each signal for revealing the operation of the embodiment of FIG. 4.

In order to write data (see FIG. 7(A)), since selector signal BSj and writing control signal W2 of selected basic block CBj are on the high level (data transfer period) and control signal RDE is on the low level, transfer gates T1 and T2 are turned on and transfer gate T3 is turned off. After the data is transferred from terminals IO1 through IO4 to bus line DBbj by means of transfer gates T1 and T2, the writing control signal W2 is switched to the low level, and transfer gate T3 is turned on while the data to be written is held by a loop comprising transfer gates T2, T3, NOR gate NR1, and inverter IV1 (data holding period) as the data is written into memory cell array 6.

Figure 7B:
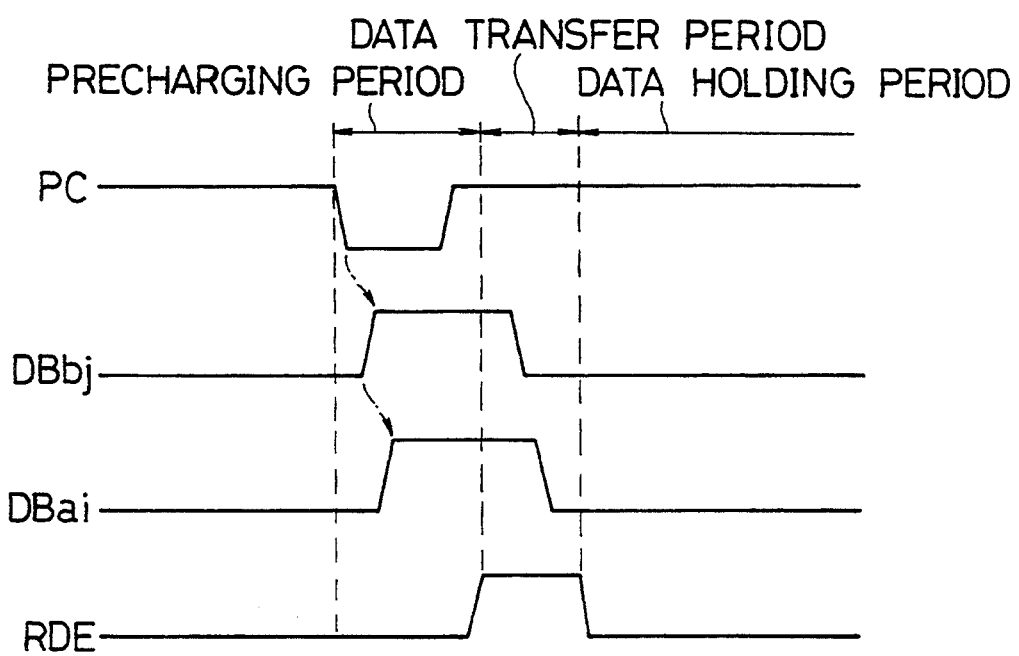

In order to read out data (see FIG. 7(B)), control signal W2 is switched to the low level and transfer gate T3 is turned on. Since transfer gate T1 of basic block CBj that was selected by active selector signal BSj is turned on, bus line DBbj of second data bus 12 is connected via transfer gates T1, T2 to bus line DBaj of first data bus 11.

After bus line DBbj and bus line DBai are connected, since precharge signal PC is switched to the low level, the bus line is precharged (precharging period). Thereafter, control signal RDE is switched to the high level to turn transfer gate T2 off, and data is read out from memory cell array 6 to second data bus 12 (data transfer period).

Sixteen-bit data of second data bus 12 is sent via first data bus 11 to terminals IO1 through IO4 in units of four bits according to selector signal BSj.

Next, the manner in which test data is written and read out during test mode will be described. When the test data is written, since all of selector signals BSj and writing control signal W2 are active on the high level and control signal RDE is active on the low level, transfer gates T1, T2 of all of basic blocks CBj are turned on and transfer gate T3 is turned off. After the test data is transferred from terminals IO1 through IO4 to data line DBbj, writing control signal W2 is switched to the low level, and the test data is held by transfer gates T1, T3, NOR gate NR1, and inverter IV1 in order that the data may be written into memory cell array 6.

When the test data is read out, since bus selector signal BSj, control signal RDE, and writing control signal W2 are all on the low level, transfer gates T2, T3 are turned on and transfer gate T1 is turned off. When the precharge signal PC is switched to the low level, the bus line DBbj of second data bus 12 is precharged, following which control signal RDE is switched to the high level, and transfer gate T2 cuts off inverter IV1 and bus line DBbj in order that the already written test data may be read out from memory cell array 6 to each bus line DBbj.

When the test data is read out to bus line DBbj, control signal RDE is switched to the low level, and transfer gate T2 is turned on in order that the read-out test data may be held by transfer gates T2, T3, NOR gate NR1, and inverter IV1. Each four-bit unit of the held data is tested for consistency within its group by the test mode comparator 8.

It is to be understood that variations and modifications of the dynamic RAM disclosed herein will be evident to those skilled in the art. It is intended that all such modifications and variations be included within the scope of the appended claims.

What is claimed is:

1. A dynamic RAM comprising a plurality of I/O terminals for entering data to be written into a memory cell and sending the same therefrom by a plurality of bits in parallel; a first data bus comprising a plurality of data lines each corresponding to one of said I/O terminals for transferring said data to be written and data to be read out; a second data bus comprising a plurality of data lines corresponding to each data line of said first data bus; a data bus select decoder for giving instructions to connect one data line of said second data bus with each corresponding data line of said first data bus during normal operation and to connect a plurality of data lines of said second data bus with each data line of said first data bus during a test mode; a plurality of basic circuit blocks each corresponding to one data line of said second data bus for carrying out said connection; and a test mode comparator which, upon receiving a test instruction to test, checks the test data read out to said second data bus to determine whether the quality of said memory cell array is normal or not, and wherein each of said basic circuit blocks comprises a first transfer gate having one end connected to the data line of said first data bus, a data amplifier having one end connected to the other end of said first transfer gate, a second transfer gate having one end connected to the other end of said data amplifier and the other end connected to the selected data line of said second data bus, a third transfer gate having its other end connected to the other end of said second transfer gate, and a gate control circuit for turning on or off said first, second, and third transfer gates; said gate control circuit, upon receiving said instructions, turning on said first and second transfer gates and turning off said third transfer gate and, after the data to be written is sent to said second data bus via said data amplifier, turning on said third transfer gate to hold said data for writing while, when data is to be read out, turning on said first, second, and third transfer gates to drive said data amplifier to precharge said first and second data buses and thereafter turning said second transfer gate off in order to read out the data.

2. The dynamic RAM as set forth in claim 1 wherein writing into and reading from said memory cells are carried out via said write data buffer and said read-out buffer respectively while input/output of data to and from said I/O terminal respectively are carried out via said data input and data output buffer respectively.

* * * * *